United States Patent
Ausserlechner

(10) Patent No.: US 7,825,656 B2
(45) Date of Patent: Nov. 2, 2010

(54) TEMPERATURE COMPENSATION FOR SPACED APART SENSORS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 751 days.

(21) Appl. No.: 11/755,429

(22) Filed: May 30, 2007

(65) Prior Publication Data

US 2008/0297955 A1     Dec. 4, 2008

(51) Int. Cl.
*G01B 7/30* (2006.01)

(52) U.S. Cl. .......................... 324/207.21; 324/207.25; 324/207.2; 324/225

(58) Field of Classification Search ............... None
See application file for complete search history.

(56) References Cited

U.S. PATENT DOCUMENTS

| | | | |
|---|---|---|---|
| 4,727,323 A * | 2/1988 | Zabler | 324/252 |
| 5,351,003 A | 9/1994 | Bauer et al. | |
| 5,818,225 A * | 10/1998 | Miekley et al. | 324/251 |
| 6,173,501 B1 * | 1/2001 | Blank et al. | 33/356 |
| 6,564,102 B1 | 5/2003 | Boveja | |
| 6,574,061 B1 | 6/2003 | Ling et al. | |
| 6,651,020 B2 * | 11/2003 | More | 702/99 |
| 6,655,652 B2 | 12/2003 | Meinhof | |
| 6,668,191 B1 | 12/2003 | Boveja | |
| 6,674,280 B1 * | 1/2004 | Goetz et al. | 324/207.21 |
| 6,694,822 B1 | 2/2004 | Ganapathi et al. | |
| 6,868,025 B2 | 3/2005 | Hsu | |
| 6,882,146 B2 | 4/2005 | Maiwald | |
| 7,053,607 B2 | 5/2006 | Sato | |
| 7,062,330 B1 | 6/2006 | Boveja et al. | |
| 7,082,377 B1 * | 7/2006 | Aslan et al. | 702/130 |
| 7,097,110 B2 | 8/2006 | Sheperek et al. | |
| 2004/0012389 A1 * | 1/2004 | Maiwald | 324/252 |
| 2010/0053789 A1 * | 3/2010 | Duric et al. | 360/31 |

OTHER PUBLICATIONS

"10-bit programmable 360° magnetic angle encoder with absolute digital and analog outputs", http://www.ams.co.at/03products/products_detail/AS5043/AS5043.htm, (accessed May 9, 2007),2.

* cited by examiner

*Primary Examiner*—Jay M Patidar
(74) *Attorney, Agent, or Firm*—Schwegman Lundberg & Woessner, P.A.

(57) ABSTRACT

A device includes a pair of individual sensors spaced apart from each other. A current source provides current to both of the individual sensors. A differential temperature sensor is coupled thermally proximate the individual sensors and provides a temperature difference signal that is combined with current from the current source to provide a correction factor for a temperature gradient across the individual sensors. Alternatively, temperature responsive excitation sources may be positioned thermally proximate the sensors to provide temperature compensation.

22 Claims, 1 Drawing Sheet

TEMPERATURE COMPENSATION FOR SPACED APART SENSORS

BACKGROUND

Magnetoresistive sensors change their resistance in relation to a magnetic field. In GMR (giant magnetoresistive) sensors formed on a chip, the resistance span is about 10%. In other words when the magnetic field is directed perpendicular to the GMR resistance path in the plane of the chip, the resistance value increases by 5% compared to the resistance in the zero-field. If the magnetic field changes polarity, the resistance value drops by 5% compared to the reference value in the zero-field. For magnetic fields that are not too large, the resistance change can be approximately linearly proportional to the magnetic field acting on the chip. The constant or slope of proportionality is referred to as the magnetic sensitivity. The magnetic sensitivity may be dependent on the temperature.

On the other hand, the resistance value also increases simply by increasing the temperature: about 0.1%/° C. Some differential GMR sensor integrated circuits (ICs) contain at least two GMR resistors at a distance of about 2.5 mm on a chip, for example. The IC evaluates the difference of the fields at both positions. As a result, the sensor may become insensitive to a homogeneous background field as the sensor's noise immunity increases. Typical applications of these kinds of sensors include so-called speed GMR sensors to detect the angular velocity of a wheel for ABS (antilock braking system) or of a crankshaft or camshaft for engine controls.

Because of the large separation between the two GMR resistors, referred to as resistance strips, it is possible for the two strips to exist at slightly different temperatures. The reason for this can be due to a non-homogeneous temperature distribution outside the sensor. A temperature gradient may be generated by the sensor itself. Dissipative losses of an output stage generate thermal waves may affect the two GMRs with different time delays and different intensities.

Due to such a temperature gradient, an offset error occurs, i.e. the two resistance strips exhibit different resistances due to the temperature difference, even in the absence of a magnetic field. If, for example the temperature difference is 0.1° C., the GMR resistances will differ by 0.01%. Since the magnetic sensitivity is about 1%/mT, the magnetic field is altered by 10 μT. While this may sound small, the difference is too much if one considers that a sensor like this typically has a jitter requirement of 1 μT.

In some sensors, an H bridge that is powered from a power source may be used. Attempts are made to arrange the dominant heat sources on the chip such that the GMR resistance strips are located on the same isotherms. However, this can only be done with a moderate amount of precision since comprehensive simulations would be required, and even then there would not be enough space on the chip to place all components at ideal locations. Even with a symmetrical layout and symmetrical distribution of heat sources on the chip, asymmetric temperature distribution on the chip occurs since the lead frame is often asymmetrical and the ground pin cannot lie in the line of symmetry for 4-pin packages for example.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A differential temperature sensor may be used in a dual resistance strip GMR. The temperature sensor detects a temperature difference between the two GMR resistance strips. A biasing circuit makes the power supply of the two GMR resistance strips suitably asymmetric as a function of temperature difference, allowing a simple correction calculation of GMR difference signal.

Figure 1:
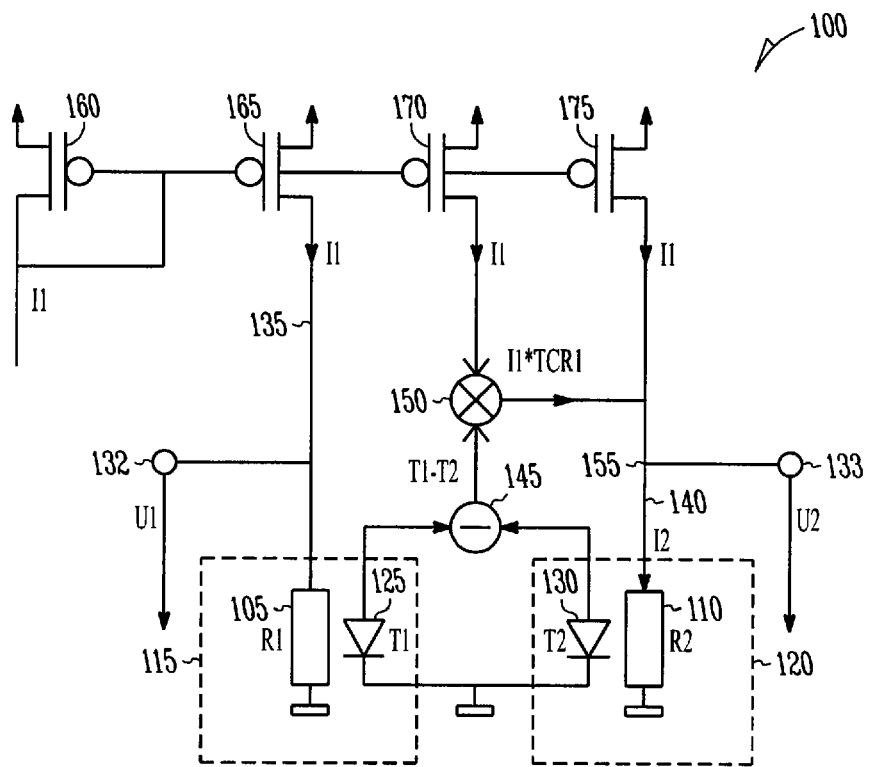
FIG. 1 is a circuit diagram of a temperature compensation circuit according to an example embodiment.

In one example embodiment, a device or circuit 100 in FIG. 1 has the following components and functions. Two GMR resistors, R1 at 105 and R2 at 110, are provided at locations outlined at 115 and at 120, where temperatures T1 and T2 and magnetic fields B1 and B2 are present. Temperature sensors 125 and 130 are disposed thermally proximate the GMR resistors R1 105 and R2 110 such that sensors 125 and 130 are at substantially the same temperature as the respective GMR resistors. Resistor R1 105 is fed an excitation signal such as a current I1 at 135, and Resistor R2 110 is fed current I2 at 140. In one embodiment, current I2 is compensated for temperature differences as detected by temperature sensors 125 and 130. Better compensation is achieved when the temperature sensors 125 and 130 are close or equal to the same temperature as the respective GMR resistors 105 and 110. Some compensation may still occur with temperature differences between the temperature sensors 125 and 130 and respective GMR resistors 105 and 110 provided the temperatures are somewhat correlated to the GMR resistor temperatures.

Voltages U1 at 132 and U2 at 133 result across the respective GMR resistors 105 and 110. The differential voltage U1−U2 should be representative of the difference in magnetic field strength B1−B2, independent of T1−T2 and (B1+B2)/2.

In one embodiment, the values of the GMR resistors R1 105 and R2 110 (sensors) change with magnetic field strength:

$$R1 = R0*(1+TCR1*(T1-T0))*(1+S0*(1+TCS1*(T1-T0))*B1)$$

$$R2 = R0*(1+TCR1*(T2-T0))*(1+S0*(1+TCS1*(T2-T0))*B2),$$

wherein it is assumed that there is no mismatch between the two sensors R1 105 and R2 110 so that both have the same resistance at reference temperature T0 and in the zero-field (=R0), and the same temperature coefficient for resistance (TCR) and temperature coefficient of magnetic sensitivity (TCS).

If there is a mismatch of the resistance, this can be smoothed once in an initial test. If there is a mismatch in the TCR or TCS, this unfortunately results in an error of higher order. Despite this limitation, a jitter improvement of about one order of magnitude should be achievable using various embodiments described.

In one embodiment,

TCR1=about 0.1%/° C.,

S0=about 1%/mT (magnetic sensitivity of the GMR-resistance at a reference temperature T0), and TCS1=about −0.01%/° C.

For the voltages:

$$U1=I1*R1$$

$$U2=I2*R2$$

Assume that B1=B2=0. Then, U1=U2, i.e. I2/I1=R1/R2=(1+TCR*(T1−T0))/(1+TCR*(T2−T0))=1+TCR*(T1−T2) for small temperature differences T1−T2.

In operation, circuit 100 impresses a current I1 135 onto the first GMR resistor 105 and a current I2 140 onto the second GMR resistor 110, wherein I2 is larger than I1 by TCR1*(T1−T2)*100%. Current I2 is provided by subtracting the temperatures at summer 145, and multiplying the result by TCR1 at 150, then adding the resulting current with I1 135 at junction 155. Current I1 135 is provided by a current source 160 and current mirrors at 165, 170 and 175.

If it is assumed that B1=B2=B, it follows under the power feed described that $$U1=I1*R0(1+TCR1*(T1-T0))*(1+S0*(1+TCS1*(T1-T0))*B)$$

$$U2=I1*(1+TCR1*(T1-T2))*R0*(1+TCR1*(T2-T0))*(1+S0*(1+TCS1*(T2-T0))*B)$$

Thus, when neglecting higher order interferences, it follows that $$(U2-U1)/(I1*R0)=$$

$$=TCR1*(T1-T2)+TCR1(T2-T0)+S0*(1+TCS1*(T2-T0))*B-TCR1*(T-T0)-S0*(1+TCS1*(T1-T0))*B=$$

$$=S0*TCS1*(T2-T1)*B$$

Thus, feed-through of the homogeneous background field into the differential signal occurs. However, this feed-through is of higher ($2^{nd}$) order: TCS1*(T2−T1).

Circuit 100 provides a simple implementation of the above circuit functions. Circuit 100 provides a differential temperature sensor and then a current mirror that imparts to current I2 a small correction factor as a function of differential temperature. Respective temperature sensors T1 125, T2 130 are arranged proximate GMR resistors R1 105, R2 110 so that sensors T1 125 and T2 130 detect the true temperature of the corresponding GMR resistors 105 and 110. In operation, the difference of the temperatures T1−T2 is calculated at 145, multiplied by I1 and TCR1 at 150 and is added to I1 at 155, to result in I2. The voltages U1 and U2 may be subtracted from one another and serve as an output signal.

Alternatively, the multiplication may be performed purely by computation in the digital domain of the IC. In such an embodiment, the signals U1 and U2 may be pre-amplified separately. This may result in more noise than in prior circuits which amplify the difference of the two signals. In the latter case, the correction of the currents is performed in the analog domain. In a further embodiment, the differential temperature sensor may be a system with a digital output, which can control the multiplication more conveniently. For instance, instead of a PMOS current mirror 170, several binary weighted current mirrors may be used and connected to the summing node 155 according to the digital output code of the temperature sensor.

Provided that TCR1*(T1−T2) is relatively small, different self-heating of the two GMR resistors due to the different currents may be neglected.

Figure 2:
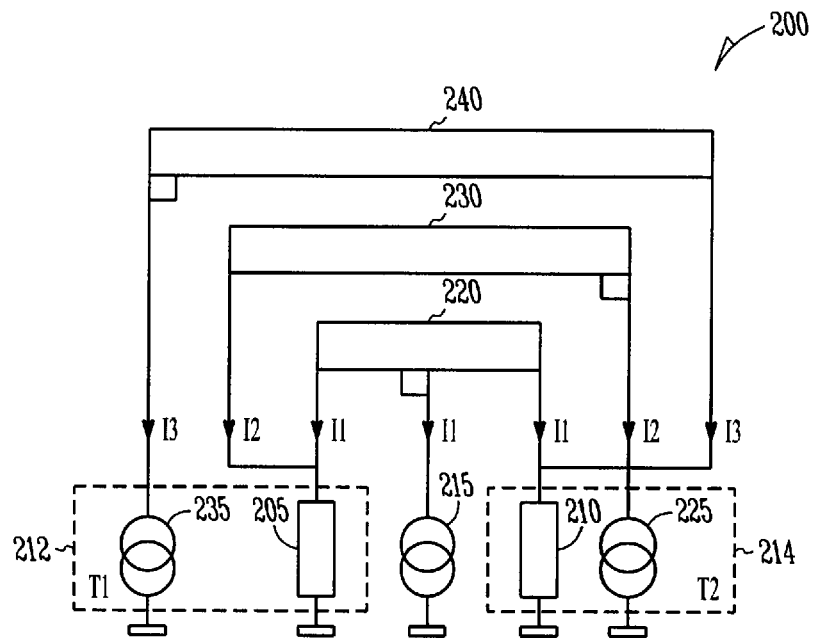
FIG. 2 is a circuit diagram of an alternative temperature compensation circuit according to an example embodiment.

An alternative circuit is illustrated at 200 in FIG. 2. GMR resistors 205, 210 are illustrated at temperatures T1 at 212 and T2 at 214, and are powered by temperature responsive excitation signals, such as a first current from a first current source 215 which is mirrored at 220 to provide substantially identical I1 current in one embodiment for both GMRs. The temperature effect of circuit 200 should ideally depend on (T1+T2)/2, i.e. the respective circuit 200 should be situated about in the middle between the two GMR resistance strips 205 and 210 in the layout (assuming that the temperature gradient between the two GMRs is linear).

In addition, a second excitation or current source 225 provides I2 (=auxiliary current) with a temperature effect depending on T2. Current source 225 is positioned thermally proximate the GMR resistor 210 such that Current source 225 is substantially the same temperature as the GMR resistor 210. I2 is mirrored at 230 and is added to the current through GMR resistor 205. Likewise, a third current source 235 produces a current I3 with a temperature effect of T1. Current source 235 is positioned thermally proximate the GMR resistor 205 such that current source 235 is substantially the same temperature as the GMR resistor 205. I3 is mirrored at current mirror 240 and added to the current through GMR resistor 210. If it is assumed that the temperature effect of the second and third current is positive and that T2>T1, the current through GMR resistor 205 will be somewhat larger than that through GMR resistor 210, since the auxiliary current through GMR resistor 205 depends on T2 and thus is larger. Since the zero-field resistance of GMR resistor 205 is smaller due to its lower temperature, suitable tuning can make the zero-field voltages at GMR resistor 205 and GMR resistor 210 substantially identical.

Alternatively, the temperature effect of the auxiliary current could also be made to be negative, and the auxiliary current resulting at T2 would then have to be subtracted from the main current through GMR resistor 205 (instead of addition) in the same way that the auxiliary current resulting at T1 is subtracted from the main current through GMR resistor 210. In one embodiment, the first, second, and third excitation sources are selectively coupled to the GMR resistors 205, 210 (sensors) to provide a correction factor for a temperature gradient across the GMR resistors 205, 210.

In a further embodiment, if the current sources 225, 235 have negative temperature coefficients, it is also possible to add I2 to I1 on GMR resistor 210 (and also to add I3 to I1 on GMR resistor 205). In yet a further embodiment, currents with positive temperature coefficients are used. In one embodiment, PTAT-current sources are used because the circuit to generate PTATs may be easier, smaller and more robust (e.g. against process spread).

The first current is represented as I1 and the second current I2*(1+TCI1*(T2−T0)) and the third current I2*(1+TCI1*(T1−T0))—in other words for T1=T2 the second and third current are identical—the offset at T2<>T1 disappears under the following condition:

$$(I1+I2*(1+TCI1*(T2-T0)))*R0*(1+TCR!*(T1-T0))=(I1+I2*(1+TCI1*(T1-T0)))*R0*(1+TCR1*(T2-T0)))$$

Whereupon:

$$I2/I1=TCR1/(TCI1-TCR1)$$

If it is further assumed that TCI1 is a PTAT current that is produced with a resistor with temperature coefficients TCR1—i.e.: TCI1=0.33%/° C.−TCR1—it follows that:

$$I2/I1 = TCR1/(0.33\%/° C. - 2*TCR1)$$

For TCR1=0.001 it follows finally that I2/I1=0.75.

In other words, the auxiliary current in one embodiment should be about 75% of the first current in order to achieve this temperature compensation.

Since the compensation functions best when the ratio of the currents is maintained precisely, the main current I1 should have the same temperature coefficient as the auxiliary currents for a perfect compensation to occur, otherwise one can only expect good compensation in the vicinity of an arbitrarily selected temperature point. However, the temperature coefficients of the currents do not necessarily need to have PTAT character.

The current sources 235 and 225 in one embodiment are in intimate thermal contact with the GMRs 205 and 210, respectively, and these GMRs are at a relatively large distance to one another. The distance in one embodiment is approximately at least 2.5 mm, which is typical for pure speed-sensing. However, for direction detection, a third GMR strip may be added in the center of a die and thus the distance of left to center GMR is merely 1.25 mm. Due to such a large distance in combination with process gradients across a semiconductor wafer, the two current sources may not match well. In one embodiment, the current sources may be trimmed either by trimming resistors 205, 210 or by trimming the currents I1, I2, I3. A resistor may be trimmed by a series connection of several small trimming resistors and switches, which tap the input current or output signal. The currents may be readily trimmed by adding small PMOS transistors to the main transistors at the input or output of the current mirror, where the small transistors are switched on or off according to a trimming code.

In one embodiment, temperature dependent current sources may be considered as temperature sensors, since they provide an output signal (current) that is a unique function of the temperature acting on them. Embodiments where the output signal is not unique, such as in the case of the currents exhibiting a maximum at some temperature within the operating temperature range and falling off beyond this temperature, the compensation would still work in the case where the temperature dependence of the GMR resistors exhibits the same behavior at the same temperature.

This principle can, in addition to GMR sensors, also be applied to Hall sensors and other differential sensors, where the difference of two sensor signals is calculated and both individual sensors are located far from one another (and thus there is the danger that the individual sensors will be at different temperatures). For some sensors, the excitation signals may be provided by voltage sources or light sources as opposed to current sources. Other such sensors may include but not be limited to XMR, CMR, tunneling MR, TMR, AMR, and in addition to resistive implementations of such sensors, may also include FET, diode, bipolar transistors, or more generally, pn-junctions. Optical based sensors may also be used. In one embodiment, TMR-sensors may readily be used instead of GMR-sensors. From a circuit point of view, TMR and GMR sensors are equivalent. Both TMR and GMR sensors are resistors dependent on the magnetic field in the plane of the die.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A device comprising:
   first and second individual sensors spaced apart from each other;
   a current source configured to provide current to each of the first and second individual sensors; and
   a differential temperature sensor disposed thermally proximate the first and second individual sensors and configured to provide a temperature difference signal that can be combined with current from the current source to provide a correction factor for a temperature gradient across the first and second individual sensors.

2. The device of claim 1 wherein the correction factor can be applied to one of the first and second individual sensors.

3. The device of claim 1 wherein the first and second individual sensors comprise GMR resistive strips.

4. The device of claim 3 wherein the differential temperature sensor comprises first and second temperature sensors, each of the first and second temperature sensors respectively disposed thermally proximate the GMR resistive strip.

5. The device of claim 4 wherein the GMR resistive strips are spaced at least approximately 1.25 mm.

6. The device of claim 4 wherein the temperature sensors comprise pn junctions having a current responsive to temperature.

7. The device of claim 6 wherein the current through the first and second temperature sensors is differenced and multiplied by a constant prior to being combined with current from the current source.

8. The device of claim 1 wherein the sensors comprises a Hall effect sensor.

9. A sensor comprising:
   a pair of individual giant magneto resistive (GMR) strips spaced apart from each other;
   a current source configured to provide current to both of the strips;
   means for sensing a difference in temperature of the strips to provide a temperature difference signal; and
   means for combining the temperature difference signal with current from the current source to provide a correction factor for a temperature gradient across the individual sensors.

10. The sensor of claim 9 wherein the correction factor is applied to one of the GMR resistive strips.

11. The sensor of claim 9 wherein the means for sensing temperature comprises a pair of temperature sensors, each temperature sensor coupled thermally to respective GMR resistive strips.

12. The sensor of claim 11 wherein the temperature sensors comprise pn junctions having a current responsive to temperature.

13. The sensor of claim 11 wherein the current through the temperature sensors is differenced and multiplied by a constant prior to being combined with current from the current source.

14. The sensor of claim 9 wherein the GMR resistive strips are spaced at least approximately 1.25 mm.

15. A sensor comprising:
   a pair of individual giant magneto resistive (GMR) strips spaced apart from each other;
   an excitation source configured to provide excitation to both of the strips; and
   means for providing a correction factor to the excitation of at least one of the strips as a function of a differential temperature across the strips.

16. A method comprising:

providing a substantially equal current from a current source to two sensors that are spaced apart from each other;

sensing a difference in temperature proximate the two sensors to provide a temperature difference signal; and combining the temperature difference signal with current from the current source to provide a correction factor for a temperature gradient across the individual sensors.

17. A device comprising:

first and second sensors spaced apart from each such that they may be at different first and second temperatures;

a first excitation source positioned to be at a temperature between the different first and second temperatures;

a second excitation source positioned proximate the first temperature to provide electrical excitation as a function of the first temperature; and a third excitation source positioned proximate the second temperature to provide electrical excitation as a function of the second temperature, wherein the first, second, and third excitation sources are selectively coupled to the first and second sensors to provide a correction factor for a temperature gradient across the first and second sensors.

18. The device of claim 17 wherein the first excitation source is positioned approximately in the middle of the temperature gradient across the first and second sensors.

19. The device of claim 18 wherein the temperature gradient is linear.

20. The device of claim 17 wherein the first, second, and third excitation sources are current sources or voltage sources.

21. A device comprising:

a first sensor and a second sensor spaced apart from each other such that they may be at different respective first and second temperatures;

a first current source positioned to be at a temperature between the different first and second temperatures and capable of providing equal first currents to the first and second sensors;

a second current source positioned proximate the first temperature and capable of providing a second current to the second sensor a function of the first temperature; and a third current source positioned proximate the second temperature and capable of providing a third current to the first sensor as a function of the second temperature, wherein the second and third currents are capable of providing a correction factor for a temperature gradient across the individual sensors.

22. The device of claim 21 wherein the first and second sensors are giant magneto resistive (GMR) sensors.

* * * * *